(12) United States Patent
Sperber

(10) Patent No.: US 10,712,394 B1
(45) Date of Patent: Jul. 14, 2020

(54) APPARATUS AND METHOD FOR TESTING COXSWAIN BOX FUNCTION

(71) Applicant: RED-E-ROW PRODUCTS, LLC, South Daytona, FL (US)

(72) Inventor: Perry R Sperber, South Daytona, FL (US)

( * ) Notice: Subject to any disclaimer, the term of this patent is extended or adjusted under 35 U.S.C. 154(b) by 0 days.

(21) Appl. No.: 16/573,203

(22) Filed: Sep. 17, 2019

(51) Int. Cl.
*G01R 31/385* (2019.01)
*G01R 31/36* (2020.01)

(52) U.S. Cl.
CPC ....... *G01R 31/385* (2019.01); *G01R 31/3646* (2019.01)

(58) Field of Classification Search
CPC .......................... G01R 31/385; G01R 31/3646
USPC ........................................................ 324/426
See application file for complete search history.

(56) References Cited

U.S. PATENT DOCUMENTS

| | | | | |
|---|---|---|---|---|
| 3,486,242 A * | 12/1969 | Aronson | ............... | G09B 9/063 434/29 |
| 5,789,738 A * | 8/1998 | Reime | ...................... | H03F 3/08 250/214 L |
| 6,054,849 A * | 4/2000 | Collier | ................... | G01R 31/66 324/133 |
| 6,351,130 B1 * | 2/2002 | Preiser | ................... | G01R 31/40 320/101 |
| 7,392,147 B2 * | 6/2008 | Lo | .................... | G01R 31/31715 702/122 |
| 10,295,611 B2 | 5/2019 | Gheng et al. | | |
| 10,330,740 B2 | 6/2019 | Partee | | |
| 2005/0215870 A1 * | 9/2005 | Rademaker | .......... | A61B 5/0002 600/301 |
| 2009/0128127 A1 * | 5/2009 | Garland | ............... | G01R 15/125 324/115 |
| 2009/0128128 A1 * | 5/2009 | Garland | ............. | G01R 19/2509 324/115 |
| 2010/0070273 A1 * | 3/2010 | Rodriguez | .............. | G10L 15/26 704/231 |
| 2018/0265172 A1 * | 9/2018 | Healy | ..................... | B63B 23/06 |
| 2019/0003837 A1 * | 1/2019 | Huhnke | .................. | H04W 4/02 |

OTHER PUBLICATIONS

Testing Cox Box Wiring in an 8 with a Multimeter; Technical support slides of Nielsen-Kellerman Co.; Sep. 24, 2015. (Year: 2015).*

* cited by examiner

*Primary Examiner* — Christopher P McAndrew
(74) *Attorney, Agent, or Firm* — Lori Sandman, Esq.

(57) ABSTRACT

An integrated apparatus and method of use for testing the equipment used in rowing watercraft is disclosed. The invention functions to test the output of a coxswain's box as well as its chargers and speakers to assure they function during rowing events, including but not limited to practice and competition. The invention comprises a cox box battery charger test gauge, a stroke rate recording tester, an external speaker tester, and a cox box speaker tester. It allows for bench testing of equipment as well as checks on the water to assure proper functioning of the cox box during use. The device is capable of working with cox boxes available from various manufacturers.

18 Claims, 6 Drawing Sheets

APPARATUS AND METHOD FOR TESTING COXSWAIN BOX FUNCTION

CROSS-REFERENCE TO RELATED APPLICATIONS

Not applicable.

STATEMENT REGARDING FEDERALLY SPONSORED RESEARCH/DEVELOPMENT

Not applicable.

REFERENCE TO SEQUENCE LISTING, A TABLE, OR COMPUTER PROGRAM LISTING COMPACT DISC APPENDIX

Not applicable.

BACKGROUND OF THE INVENTION

The present invention relates to the field of measuring and testing; specifically, it discloses an integrated apparatus and method for testing and assessing the separate signals, indicators and functions of a coxswain's box, hereinafter a "cox box", to assure proper function of the equipment used in sport rowing, including but not limited to sweep rowing and sculling.

Rowing sports, particularly recreational and competitive sculling and sweep rowing, have a deep and diverse cultural history, and remain popular globally today. In rowing watercraft with multiple crew members, proper timing and harmonized rate of movement is critical in order to effectively propel the boat as a team. The coxswain is the person who delivers the rowing rhythm to help the rowers maintain this timing and steer the boat. Typically, the coxswain keeps track of timing with a device called a cox box. Cox boxes are commercially available and generally connect to the electronic wiring system of a boat in order to collect data. This data is then sent across the boat's wiring system to the cox box to display calculations of speed and other pertinent information to the coxswain. Occasionally, either the cox box or the electronic wiring system of a boat will malfunction and cause incorrect information to be displayed. Time, energy and other resources must be invested in troubleshooting the electronic systems of the boat to determine the specific component that has failed; often the troubleshooting is unsuccessful in locating the issue.

Currently, most cox boxes include basic troubleshooting methods that are product or manufacturer specific in order to test functionality. These methods usually don't cover the full functionality of the system, so many components that could be causing issues are left untested. If the problem is the cox box and the issue with the cox box is not discovered, it usually leads to an unnecessary replacement of working parts of the system instead of simple repairs or replacement of specific malfunctioning components of the cox box itself.

What is needed is a reliable external tester for testing the full functionality of a cox box that can assure that the cox box itself as well as parts related to the cox box are functioning correctly. As disclosed herein, the present apparatus and method fulfills this need.

SUMMARY OF THE INVENTION

An integrated apparatus and method of use for measuring and testing the equipment used in sculling and sweep rowing boats is disclosed herein. Specifically, the invention functions to test the output of a cox box as well as chargers and speakers associated with it to ensure they function during rowing events, including but not limited to practice and competition.

The invention comprises at least a cox box battery charger test gauge, a stroke rate recording tester, an external speaker tester, and a cox box speaker tester. It allows for bench testing of equipment as well as checks on the water to assure proper functioning of the cox box during use. The device is capable of working with cox boxes available from various manufacturers.

In the embodiment presented in the attached drawings, an external enclosure protects the electronic components of the device. The enclosure comprises a digital, analog or other signal display and one or more actuators; switches are used underneath the display in this embodiment to actuate the apparatus's functions, but one skilled in the art would recognize that any suitable actuation component, including but not limited to buttons, dials, touchpads, or similar functioning component could be employed and still be within the scope of this disclosure. The enclosure additionally includes a plurality of connection ports, at least one for a cox box charger and at least one for an audio speaker. The apparatus also includes a male wire connection for attachment with the cox box.

The enclosure may be constructed of a variety of materials; in one embodiment durable, lightweight, water and weather resistant materials are used. The enclosure comprises fastening apertures for connecting the various parts and internal mounting points for the internal components. The internal components include a power supply such as a battery pack, a circuit card, voltmeter, and one or more internal speakers secured to the enclosure via fasteners or other securing means.

The enclosure also houses the wire connections utilized by the internal components of the device. The internal connections of the device connect the battery pack to the circuit card and stroke rate test switch in order to supply power to the system. The circuit card mechanically and electrically supports and connects the apparatus's electronic components, and is connected to a connector wire or cable and the stroke rate test switch. The connector is capable of interfacing with a cox box to be tested, and also connected to the speaker test switch, which is connected to the internal speaker and the speaker port. The cox box connector (a) transmits the audio signal to the speakers and (b) receives the stroke rate signal from the circuit card. The charger port is connected to the voltmeter; the charger port and voltmeter do not connect with other internal components.

The apparatus is powered, and in one embodiment is powered by batteries for portability. However, any suitable power source could be employed. It could be readily adapted to be suitable for plugging in to a standard wall outlet and used on a work station, or used with solar or other alternative power sources.

It is an object of this invention to provide a portable, integrated multi-functional testing device and method for identifying equipment problems and assuring proper equipment function in rowing sports.

REFERENCE CHARACTERS USED IN THE DRAWINGS

5. Enclosure
6. Faceplate
10. Display

15. Stroke rate test actuator
20. Speaker test actuator
25. Cox box connector
30. Charger port
35. Speaker port
40. Internal speaker
41. Speaker fasteners
45. Battery pack
50. Circuit card
55. Voltmeter

BRIEF DESCRIPTION OF THE VIEWS OF THE DRAWINGS

The various features, aspects and advantages of the present invention will become better understood with regard to the following description, appended claims and accompanying drawings where:

DESCRIPTION OF THE INVENTION

In the Summary of the Invention presented above and in the Description of the Invention and Claims below, and in the accompanying Drawings, reference is made to particular features, including method steps of the invention. It should be understood that the disclosure in this specification includes all possible combinations of such particular features. Where a particular feature is disclosed in the context of a particular aspect or embodiment of the invention, or a particular claim, that feature can also be used to the extent possible, in combination with and in the context of other particular aspects and embodiments of the invention and in the invention generally. Also, where reference is made to a method comprising two or more defined steps, the steps can be carried out in any order or simultaneously, except where the context excludes that possibility, and the method can include one or more other steps which are carried out before any of the defined steps, between two of the defined steps, or after all the defined steps.

Figure 1:
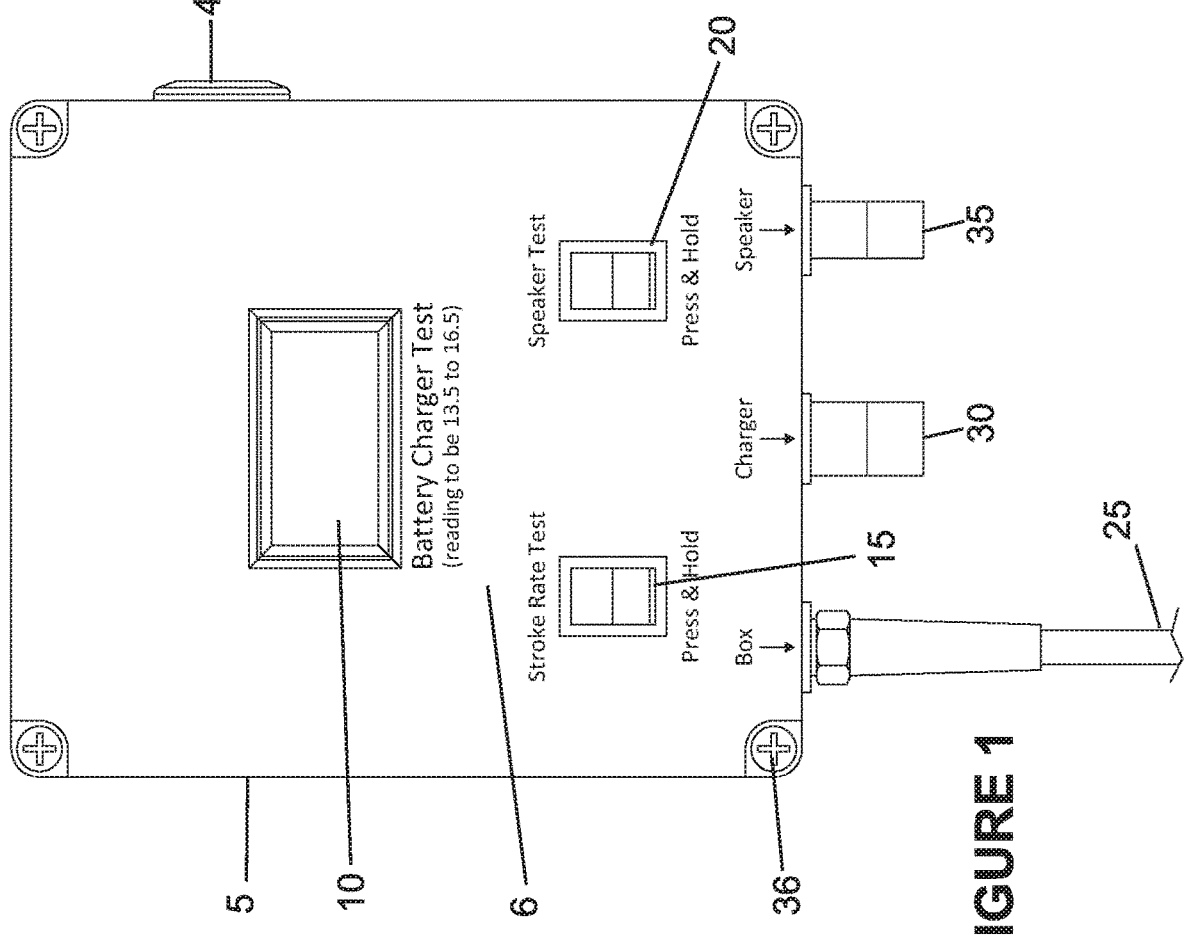
FIG. 1 shows a front view of an embodiment of the apparatus of the invention.

The text presented on the drawings of the apparatus in FIG. 1 is an example of actual text printed on the particular embodiment of the apparatus shown. This text is exemplary in nature and could be printed or otherwise displayed in any language, format or display type with any information and any range applicable to desired functionality of the apparatus and equipment being tested.

An apparatus and method of using the apparatus for testing the various multiple functions of a cox box and related components is disclosed. The invention integrates several key functional tests into a single device to assure the proper working of a cox box and related components. It is portable, durable, and may be constructed of water and weather resistant materials.

The apparatus comprises an enclosure 5, which contains and protects the circuitry and internal components. At least a circuit card 50, one or more power sources such as batteries which may be configured as a battery pack 45, and one or more internal speakers 40 are arranged within the enclosure 5. In the embodiment depicted in FIG. 1, the apparatus comprises several sides including a front face or faceplate 6 of the enclosure 5. The enclosure 5 is occupied by a display 10, a stroke rate test switch 15 and a speaker test switch 20. An adjacent side of the enclosure 5 includes a speaker cutout 41 for the internal speaker 40 to occupy. A different side of the enclosure 5 includes a cox box connector 25 for attachment to and electronic connection with a cox box.

Figure 2:
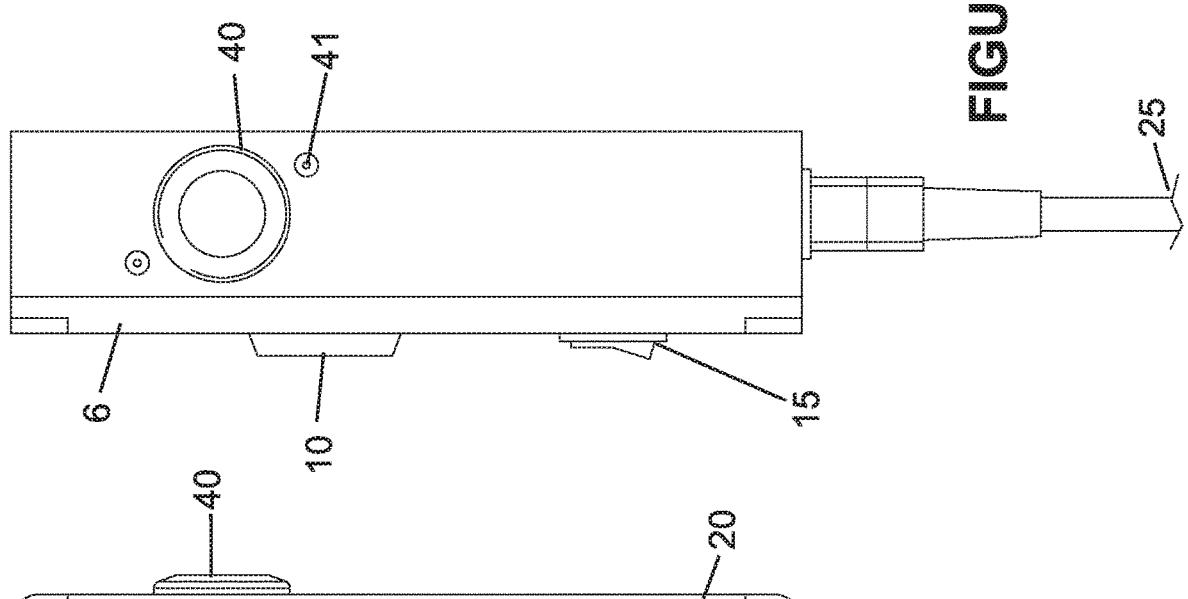
FIG. 2 shows a view of the embodiment of the apparatus of the invention shown in FIG. 1 from the side.

In the embodiment shown in FIGS. 1 and 2, the cox box enclosure 5 is generally quadrilateral. A faceplate 6 removeably attaches to sides of the apparatus with fasteners at each of the four corners; as shown in FIG. 1, corner fasteners 36 removeably secure the faceplate 6 so that it can be removed to expose the internal components of the apparatus. Fasteners, including the corner fasteners 36 as used herein can include threaded or unthreaded fasteners, nuts and bolts, hook fasteners, or screws; applicant intends to encompass within the language any structure presently existing or developed in the future that performs the same function.

In the embodiment shown in FIG. 1, a cox box connector 25 comprising a chord or wire connects a cox box to be tested with the apparatus. In one embodiment, the cox box connector 25 is a five-pin male connector capable of transmitting an electrical signal; those skilled in the art will appreciate that many kinds of connectors can accomplish this task. A charger port 30 is fitted within the enclosure 5 of the apparatus; a preferred embodiment includes a five-pin charger port 30 capable of transmitting an electrical signal, those skilled in the art will appreciate that many kinds of ports or functionally equivalent connections can accomplish this task. Similarly, a speaker port 35 of the apparatus is also located within the enclosure, and an embodiment incorporates a two-pin port capable of transmitting an electrical signal, but those skilled in the art will appreciate that many kinds of ports or functionally equivalent connections can also accomplish this task.

A stroke rate test actuator 15 and a speaker test actuator 20 are also located on the enclosure. These actuators may be configured as switches, and control the production of a stroke rate electrical signal that is transmitted to the cox box connector 25 of the apparatus and sound from the speakers, respectively. Since audio output is critical for a coxswain, the cox box's microphone can be tested with the invention by connecting it to a cox box through the cox box connector 25, turning on the cox box, and speaking into the cox box's microphone. The apparatus can also test boat speaker function. The speaker test actuator 20 controls the transmittal of electrical signals between the cox box and an internal speaker 40. The internal speaker 40 of the apparatus is held in place on the enclosure 5 with speaker fasteners 41. The cox box connector 25 of the apparatus is connected to the internal speaker 40 in order to facilitate the transmittal of an electrical signal from the microphone of a cox box to the internal speaker 40 of the apparatus.

The external speaker to be tested is plugged in to the speaker port 35. Actuating the speaker test actuator 20 in the embodiment presented is accomplished by pressing and holding the speaker test actuator 20. Output from the apparatus's internal speaker 40 will be audible if the cox box's audio output system is functioning.

The display 10 is also shown in FIG. 1. This display 10 shows or exhibits measurements and test readout, and is capable of displaying at least three numbers and a decimal point; those skilled in the art will appreciate that many kinds of displays, either digital, analog or mechanical, including but not limited to dials, gauges and readouts could be used and be within the scope of this invention. In the embodiment shown, a digital display 10 exhibits measurements and test readout and provides information on functionality being tested and measured; in one embodiment it is capable of directly displaying information on the output of a battery charger. In this embodiment, the charger port 30 is connected to a voltmeter 55 within the enclosure in order to measure the voltage being produced by a cox box charger, which is transmitted to the display 10. The reading on the display surface should be within a target range to assure the charger is functional. In the embodiment presented in FIG. 1, the range is printed below the readout indicating operative functionality in the specific range of 13.5 to 16.5; other settings and display types could be used.

FIG. 2 illustrates an embodiment of the apparatus of the invention from a side view. From this view the internal speaker 40 and fastening points for speaker fasteners 41 are shown. The internal speaker is attached by the speaker fasteners 41 to the inside of the enclosure 5. The faceplate 6 is also releasably fastened to the enclosure 5 so that internal components can be accessed, and batteries can be changed. From this side view, the display 10 and actuator switch profile of the stroke rate test actuator 15 of this particular embodiment are shown.

Figure 3:
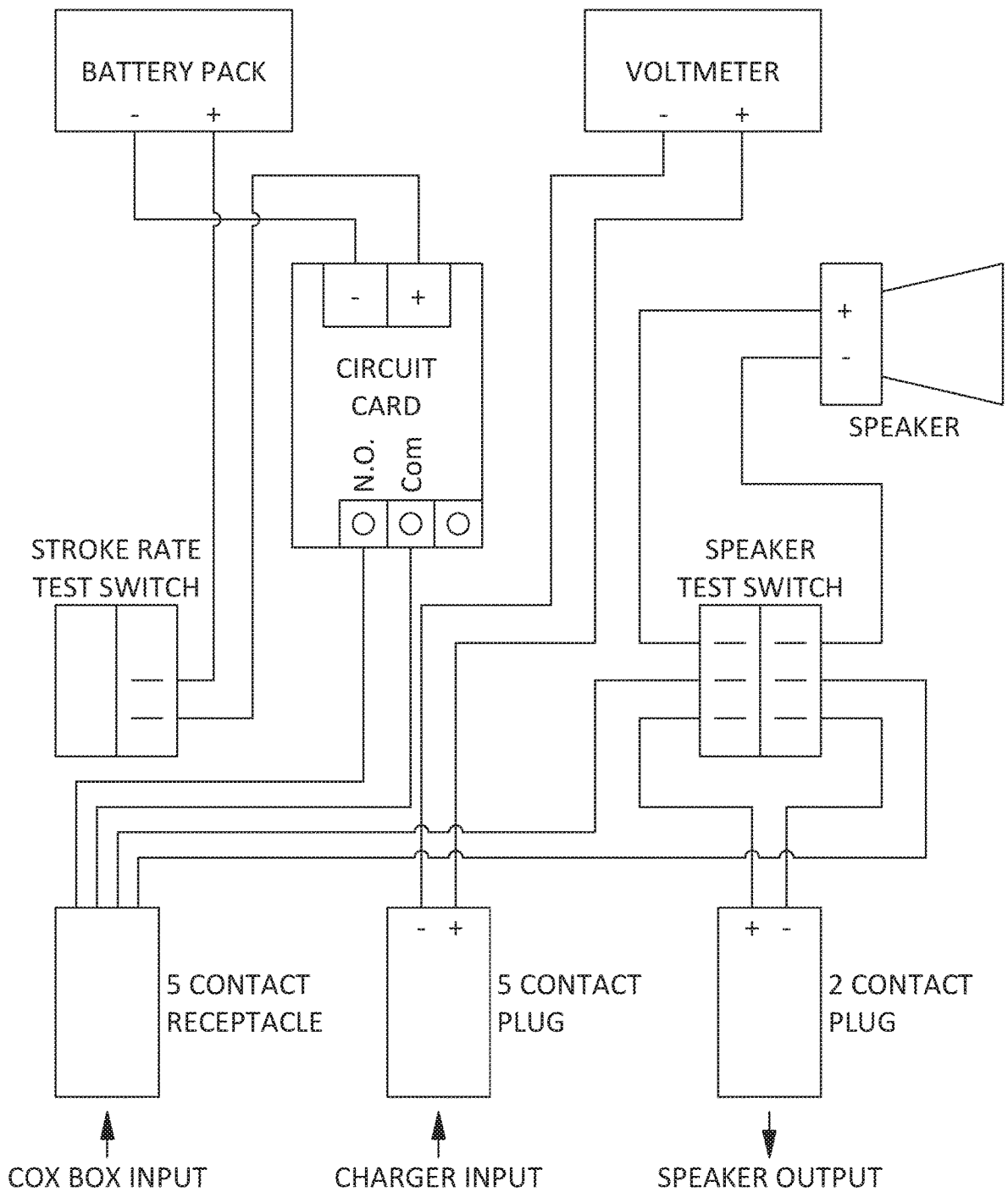
FIG. 3 is a circuit diagram of the apparatus of the invention.

FIG. 3 is a circuit diagram of the apparatus of the invention. The device is powered; in a preferred embodiment a power source such as a battery pack 45 is connected to the circuit card 50 in order to provide power to the internal speaker 40. Although a battery pack is used as a power source in this embodiment, various types of power sources could be used and fall within this disclosure. The battery pack 45 is also connected to the speaker test actuator 20 in order to allow the user to toggle the transmittal of an electrical signal from a cox box microphone to the external speaker of a cox box. The battery pack 45 is also connected to the stroke rate test actuator 15 in order to allow the user to toggle the stroke rate signal on and off.

Figure 4:
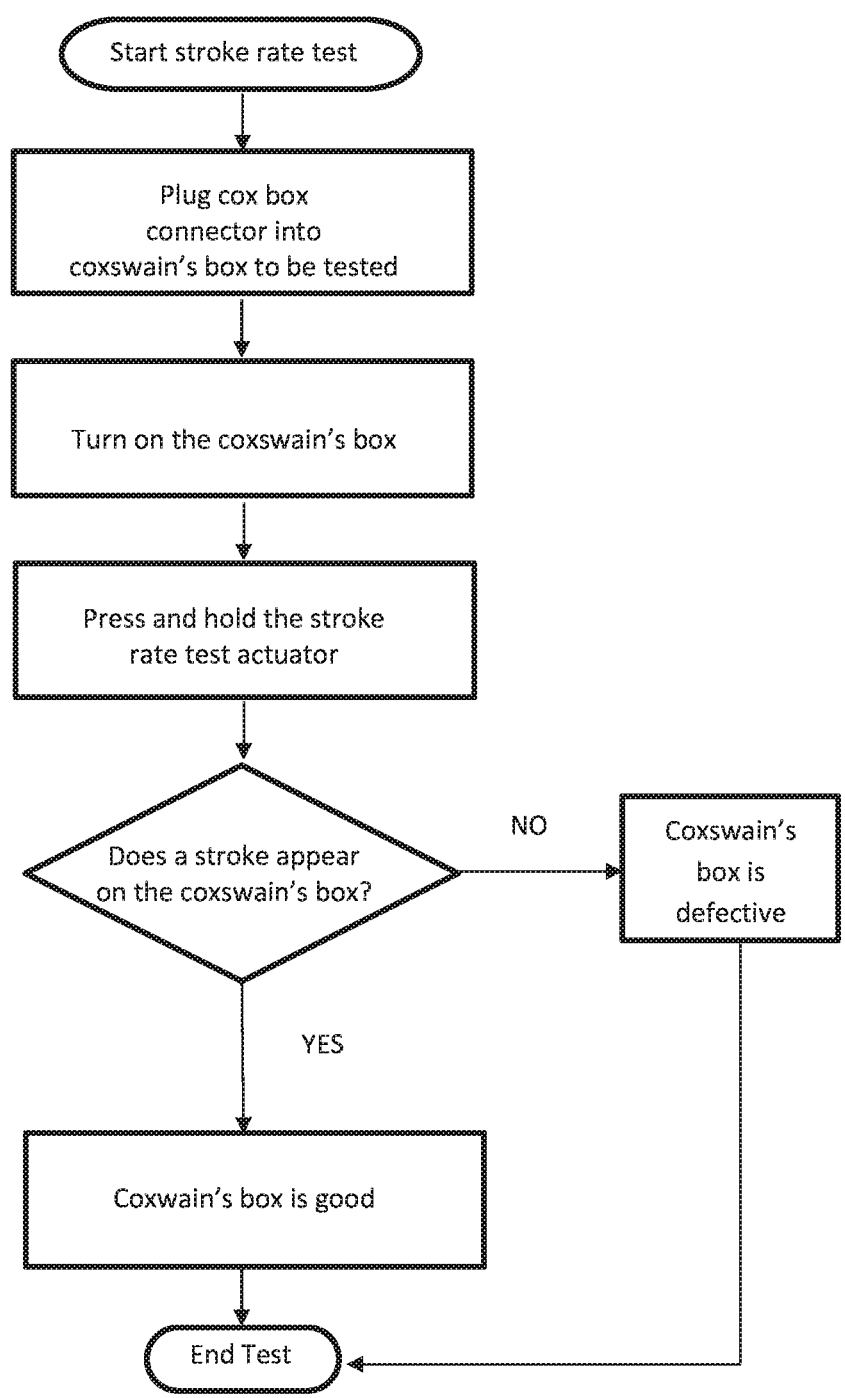
FIG. 4 is a flow chart illustrating a method of using the apparatus of the invention for testing the stroke rate of a cox box.

FIG. 4 is a flow chart illustrating a method of using the apparatus of the invention for testing the stroke rate of a cox box. The cox box connector 25 is responsible for both the audio input and receiving the stroke rate pulsing from the circuit card 50. The method comprises the steps of connecting the cox box connector 25 of the apparatus to the cox box rate recording port and turning on the cox box; pressing and holding the stroke rate actuator 15; and observing the readout on the cox box. If the cox box displays a stroke rate of thirty strokes per minute then the cox box is functioning properly. If any other stroke rate is displayed, then the cox box is malfunctioning.

Figure 5:
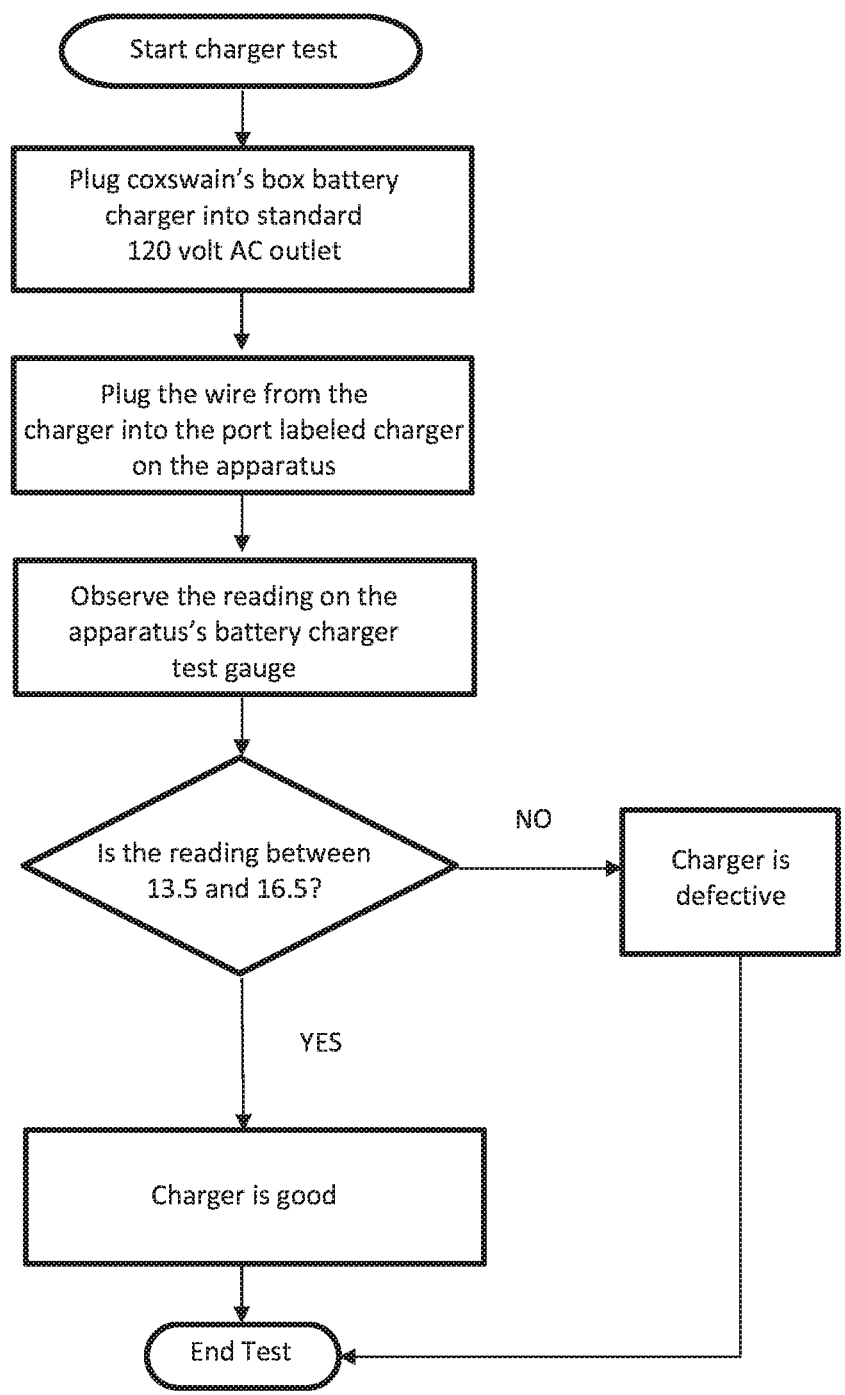
FIG. 5 is a flow chart illustrating method of using the apparatus of the invention for testing the charger of a cox box.

FIG. 5 is a flow chart illustrating method of using the apparatus of the invention for testing the charger of a cox box. The method comprises powering the cox box charger; in the embodiment presented, the cox box with the battery charger to be tested is plugged into a standard 120-volt AC outlet. The wire from the charger is plugged into the charger port 30 on the apparatus, and the reading on the apparatus is observed. In the embodiment shown, if the display 10 on the apparatus reads between 13.5 and 16.5 the charger is working properly. Any number displayed outside the range confirms that the charger is defective.

Figure 6:
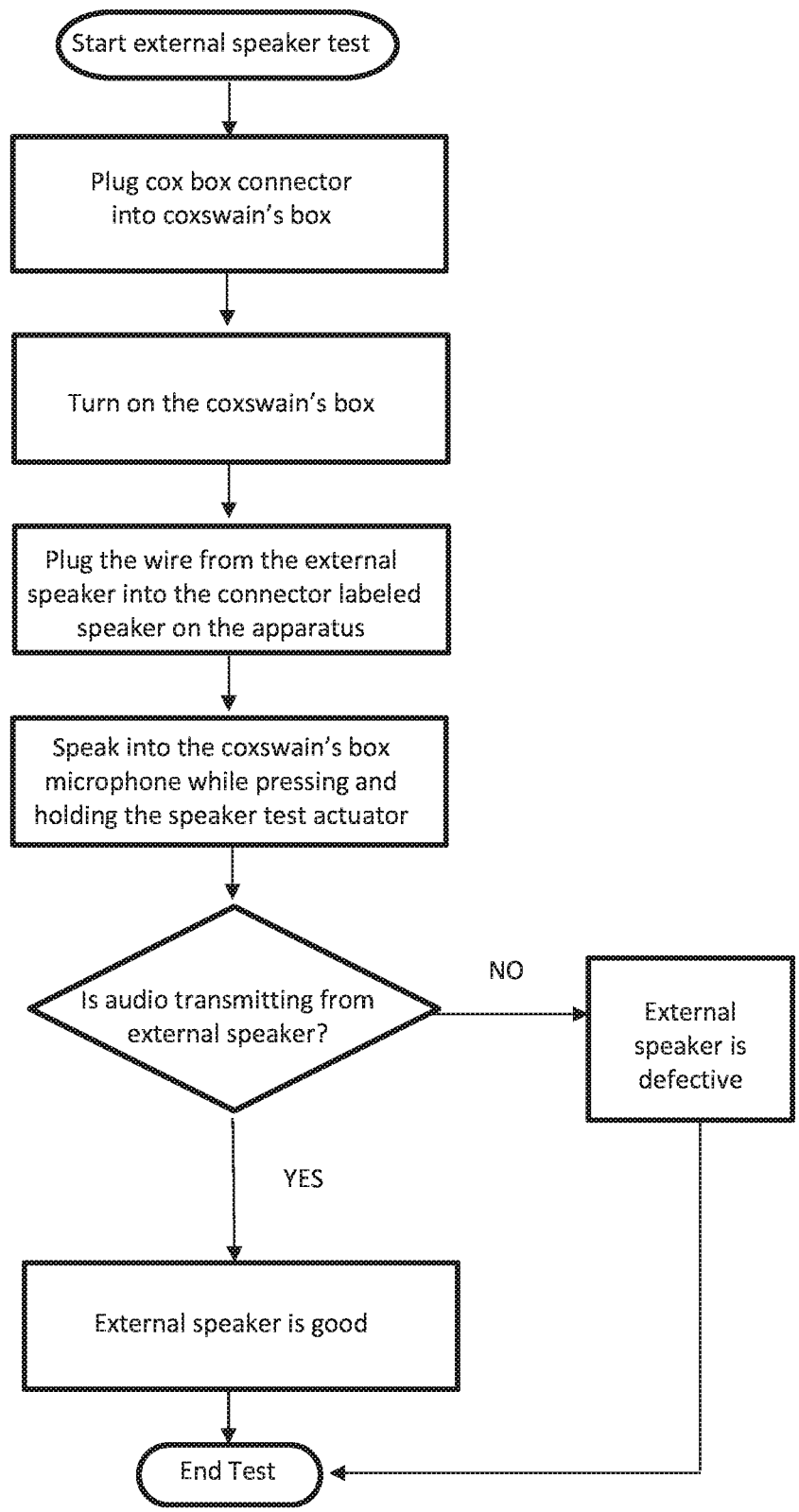
FIG. 6 is a flow chart illustrating a method of using the apparatus of the invention for testing the external speaker of a cox box.

FIG. 6 is a flow chart illustrating a method of using the apparatus of the invention for testing the external speaker of a cox box. The method comprises connecting the cox box connector 25 of the apparatus with a cox box and powering on the cox box; connecting the wire from the external speaker of the cox box to the speaker port 35 on the apparatus; and speaking into the cox box microphone while pressing and holding the speaker test actuator 20. If audio is being emitting from the external speaker of the cox box the speaker is functioning properly; if no audio is coming from the external speaker then the speaker is defective.

Figure 7:
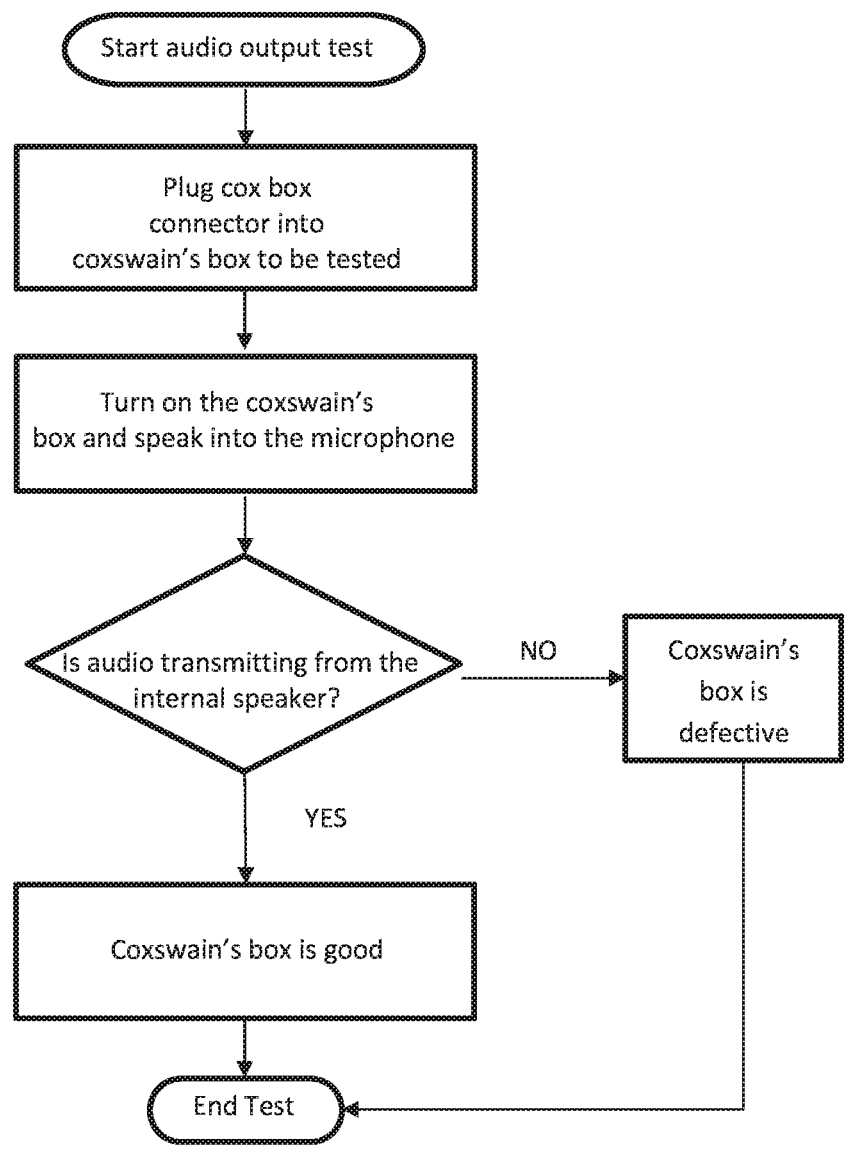
FIG. 7 is a flow chart illustrating a method of using the apparatus of the invention for testing the audio output of a cox box.

FIG. 7 is a flow chart illustrating a method of using the apparatus of the invention for testing the audio output of a cox box. The method here comprises connecting the cox box connector 25 of the apparatus into the cox box being tested. Next, turn on the cox box and speak into the microphone of the cox box. If audio is clearly emitting from the apparatus's speaker then the cox box is functioning properly, if audio is not clearly emitting from the apparatus's speaker then the cox box is defective.

All the features and method steps disclosed in this specification (including any accompanying claims, abstract and drawings) may be replaced by alternative features or steps serving the same, equivalent or similar purpose, unless expressly stated otherwise.

I claim:

1. An apparatus for testing and assessing the separate signals,
    indicators and functions of a coxswain's box and related equipment used in rowing sports, comprising:
    i. an enclosure further comprising one or more actuators to engage the testing functions of the apparatus and one or more ports for connecting equipment to be tested;
    ii. a circuit card that mechanically and electrically supports and connects the apparatus's electronic components;
    iii. a voltmeter;
    iv. a power supply;
    v. one or more speakers;
    vi. a cox box connector capable of transmitting a signal and connecting the apparatus to a cox box;
    vii. a display for exhibiting measurements and test readout; and
    viii. fastening apertures;
    wherein the apparatus is fully capable of testing and assessing the separate signals, indicators and functions of a coxswain's box and related equipment used in rowing sports.

2. The apparatus of claim 1, wherein the enclosure further comprises a removeably attached faceplate secured to the apparatus by fasteners at fastening apertures, such that said faceplate can be removed to expose the internal components of the apparatus.

3. The apparatus of claim 1, wherein the enclosure further comprises two actuators.

4. The apparatus of claim 1, wherein the display is located on the enclosure and is digital, analog or mechanical.

5. The apparatus of claim 1, wherein the power supply is a battery pack.

6. The apparatus of claim 1, wherein the enclosure has at least two ports for receiving incoming signals including a first speaker port for testing external speaker function, and a second battery charger port.

7. The apparatus of claim 1, wherein the cox box connector comprises a five-pin connector capable of interfacing with a cox box for testing and transmitting an electrical signal.

8. The apparatus of claim 2 wherein the internal components comprise a power supply, a circuit card, a voltmeter, and one or more internal speakers secured to the enclosure via fasteners or other securing means.

9. The apparatus of claim 3, wherein at least one actuator controls the production of a stroke rate electrical signal.

10. The apparatus of claim 3, wherein at least one actuator controls the electrical transmittal of audio signal between a cox box and the apparatus.

11. The apparatus of claim 6, wherein one or more of the ports is a five-pin port.

12. The apparatus of claim 6, wherein one or more ports is a two-pin port.

13. The apparatus of claim 7, wherein the cox box connector is a five-pin connection wire capable of transmitting the audio input between a cox box and the apparatus and receiving the stroke rate pulsing from the circuit card.

14. The apparatus of claim 1 wherein the enclosure is water and weather resistant.

15. A method of testing the stroke rate of a cox box using the apparatus of claim 1, comprising the steps of: i) connecting the apparatus of claim 1 to a power supply; ii) connecting the cox box connector of the apparatus to the cox box; iii) turning on the cox box; iv) pressing and holding the stroke rate actuator; and v) observing the readout on the cox box to identify proper stroke rate.

16. A method of testing the charger of a cox box comprising the steps of: i) connecting the apparatus of claim 1 to a power supply; ii) powering the cox box charger; iii) plugging the wire from the cox box charger into the charger port on said apparatus; iv.) observing the display on said apparatus indicating functionality.

17. A method of testing the external speaker of a cox box using the apparatus of claim 1, comprising the steps of: i) connecting the apparatus of claim 1 to a power supply; ii) connecting the cox box connector of the apparatus to a cox box to be tested; iii) powering on the cox box; iv) connecting the wire from the external speaker of the cox box to a speaker port on the apparatus; v) speaking into the cox box microphone while pressing and holding a speaker test actuator; and vi) observing if audio signal is being emitting from the external speaker of the cox box.

18. A method of using the apparatus of claim 1 for testing the audio output of a cox box comprising the steps of i) connecting the apparatus of claim 1 to a power supply; ii) connecting the cox box connector of the apparatus into the cox box being tested; iii) powering on the cox box; iv) speaking into the microphone of the cox box; and v) observing if audio is clearly emitting from the apparatus's speaker.

* * * * *